(12) United States Patent
Qi et al.

(10) Patent No.: US 10,497,758 B2
(45) Date of Patent: Dec. 3, 2019

(54) DISPLAY SUBSTRATE AND MANUFACTURE METHOD THEREOF, DISPLAY PANEL

(71) Applicants: BOE TECHNOLOGY GROUP CO., LTD., Beijing (CN); BEIJING BOE DISPLAY TECHNOLOGY CO., LTD., Beijing (CN)

(72) Inventors: Yonglian Qi, Beijing (CN); Lianjie Qu, Beijing (CN); Bingqiang Gui, Beijing (CN); Hebin Zhao, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 4 days.

(21) Appl. No.: 15/745,008

(22) PCT Filed: Jun. 30, 2017

(86) PCT No.: PCT/CN2017/091037
§ 371 (c)(1),
(2) Date: Jan. 15, 2018

(87) PCT Pub. No.: WO2018/120711
PCT Pub. Date: Jul. 5, 2018

(65) Prior Publication Data
US 2019/0013362 A1    Jan. 10, 2019

(30) Foreign Application Priority Data

Dec. 29, 2016 (CN) .......................... 2016 1 1245730

(51) Int. Cl.
*H01L 29/08* (2006.01)
*H01L 27/32* (2006.01)
(Continued)

(52) U.S. Cl.
CPC ...... *H01L 27/322* (2013.01); *G02F 1/133617* (2013.01); *H01L 27/3211* (2013.01);
(Continued)

(58) Field of Classification Search
None
See application file for complete search history.

(56) References Cited

U.S. PATENT DOCUMENTS

2015/0009444 A1* 1/2015 Zhao ..................... G02F 1/1368
349/43
2015/0219958 A1   8/2015 Zhang et al.
(Continued)

FOREIGN PATENT DOCUMENTS

| CN | 103235356 A | 8/2013 |
|---|---|---|
| CN | 105182595 A | 12/2015 |
| JP | 2007-157608 A | 6/2007 |

OTHER PUBLICATIONS

International Search Report and Written Opinion dated Sep. 7, 2017; PCT/CN2017/091037.

*Primary Examiner* — Hung K Vu

(57) ABSTRACT

A display substrate, a manufacture method thereof and a display panel are provided. The display substrate includes: a first substrate; a plurality of pixel units included in the first substrate, each of the pixel units at least including a first sub-pixel unit, a second sub-pixel unit and a third sub-pixel unit; a medium film laminated layer arranged on the first substrate, the medium film laminated layer at least covering the first sub-pixel unit and the second sub-pixel unit; the medium film laminated layer is configured to eliminate blue light in a first wavelength range passing the medium film laminated layer, the medium film laminated layer includes at least one first medium film layer and at least one second medium film layer which are laminated alternately, and a
(Continued)

refractive index of the first medium film layer is greater than a refractive index of the second medium film layer.

20 Claims, 4 Drawing Sheets

(51) Int. Cl.
*H01L 51/52* (2006.01)
*H01L 51/56* (2006.01)
*H01L 51/50* (2006.01)
*G02F 1/1335* (2006.01)

(52) U.S. Cl.
CPC ...... *H01L 51/5036* (2013.01); *H01L 51/5206* (2013.01); *H01L 51/5221* (2013.01); *H01L 51/5271* (2013.01); *H01L 51/56* (2013.01); *G02F 2201/307* (2013.01); *G02F 2203/055* (2013.01); *H01L 51/5253* (2013.01); *H01L 2251/5315* (2013.01)

(56) References Cited

U.S. PATENT DOCUMENTS

2016/0276617 A1* 9/2016 Qi .................. H01L 51/5212
2017/0059930 A1   3/2017 Wu

\* cited by examiner

DISPLAY SUBSTRATE AND MANUFACTURE METHOD THEREOF, DISPLAY PANEL

The present application claims priority of Chinese Patent Application No. 201611245730.3 filed on Dec. 29, 2016, the disclosure of which is incorporated herein by reference in its entirety as part of the present application.

TECHNICAL FIELD

At least one embodiment of the present disclosure relates to a display substrate and a manufacture method thereof, and a display panel.

BACKGROUND

In a structure of a display panel, an array structure and a color filter structure may be made on a same substrate, and the color filter structure may be made above the array structure, which can be used to better realize a large-sized display panel. In addition, the color filter structure may also be fabricated on an opposite substrate opposite to an array substrate in the display panel.

SUMMARY

At least one embodiment of the present disclosure provides a display substrate, the display substrate comprises: a first substrate; a plurality of pixel units included in the first substrate, each of the pixel units at least including a first sub-pixel unit, a second sub-pixel unit and a third sub-pixel unit; a medium film laminated layer arranged on the first substrate, the medium film laminated layer at least covering the first sub-pixel unit and the second sub-pixel unit, wherein the medium film laminated layer is configured to eliminate blue light in a first wavelength range passing the medium film laminated layer, the medium film laminated layer includes at least one first medium film layer and at least one second medium film layer which are laminated alternately, and a refractive index of the first medium film layer is greater than a refractive index of the second medium film layer.

For example, in the display substrate provided by at least one embodiment of the present disclosure, a center wavelength of the blue light has a range of 400 to 460 nanometers.

For example, in the display substrate provided by at least one embodiment of the present disclosure, an optical thickness of each film layer in the medium film laminated layer is a quarter of the center wavelength of the blue light.

For example, in the display substrate provided by at least one embodiment of the present disclosure, the medium film laminated layer is configured to eliminate blue light having bandwidth within at least 35 nanometers with respect to the center wavelength.

For example, in the display substrate provided by at least one embodiment of the present disclosure, the optical thickness of each film layer in the medium film laminated layer satisfies a formula as follows:

$$2nh=(m-0.5)\lambda \quad m=1,2,3 \ldots$$

where, $nh$ is an optical thickness of a corresponding film layer; $n$ is a refractive index of the corresponding film layer; $h$ is a thickness of the corresponding film layer; $m$ is an interference level; and $\lambda$ is a center wavelength of light.

For example, in the display substrate provided by at least one embodiment of the present disclosure, the first medium film layer is made of at least one of silicon nitride, zinc sulfide, aluminum and silver; and/or the second medium film layer is made of at least one of silicon oxide and magnesium fluoride.

For example, in the display substrate provided by at least one embodiment of the present disclosure, each sub-pixel unit of the pixel unit includes an organic light-emitting diode, the organic light-emitting diode emitting white light or blue light.

For example, in the display substrate provided by at least one embodiment of the present disclosure, the organic light-emitting diode at least includes a first electrode layer, a light-emitting layer and a second electrode layer which are laminated sequentially.

For example, in the display substrate provided by at least one embodiment of the present disclosure, the first sub-pixel unit is a red sub-pixel unit, the second sub-pixel unit is a green sub-pixel unit, and the third sub-pixel unit is a blue sub-pixel unit.

For example, in the display substrate provided by at least one embodiment of the present disclosure, the blue sub-pixel unit includes a blue color filter arranged on a light outgoing side of the organic light-emitting diode.

For example, in the display substrate provided by at least one embodiment of the present disclosure, the blue sub-pixel unit further includes the medium film laminated layer located on a side of the blue color filter away from the organic light-emitting diode.

For example, in the display substrate provided by at least one embodiment of the present disclosure, the organic light-emitting diode emits blue light, the green sub-pixel unit includes a green fluorescent film arranged between the medium film laminated layer and the organic light-emitting diode.

For example, in the display substrate provided by at least one embodiment of the present disclosure, the organic light-emitting diode emits white light, the green sub-pixel unit includes a green fluorescent film and a green color filter arranged between the medium film laminated layer and the organic light-emitting diode.

For example, in the display substrate provided by at least one embodiment of the present disclosure, the green color filter is arranged between the green fluorescent film and the medium film laminated layer.

For example, in the display substrate provided by at least one embodiment of the present disclosure, the organic light-emitting diode emits blue light, the red sub-pixel unit includes a red fluorescent film arranged between the medium film laminated layer and the organic light-emitting diode.

For example, in the display substrate provided by at least one embodiment of the present disclosure, the organic light-emitting diode emits white light, the red sub-pixel unit including at least one of a red fluorescent film and a red color filter arranged between the medium film laminated layer and the organic light-emitting diode.

For example, in the display substrate provided by at least one embodiment of the present disclosure, the red color filter is arranged between the red fluorescent film and the medium film laminated layer.

At least one embodiment of the present disclosure provides a display panel, comprising the display substrate as mentioned above.

At least one embodiment of the present disclosure provides a manufacture method of a display substrate, the manufacture method comprises: providing a first substrate including a plurality of sub-pixel units; forming a medium film laminated layer on the first substrate; wherein, the medium film laminated layer is configured to eliminate blue light in a first wavelength range passing the medium film laminated layer, the medium film laminated layer includes at least one first medium film layer and at least one second medium film layer which are laminated alternately, and a refractive index of the first medium film layer is greater than a refractive index of the second medium film layer.

For example, in the manufacture method of a display substrate provided by at least one embodiment of the present disclosure, the forming the medium film laminated layer on the first substrate includes a plasma chemistry vapor deposition.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

Figure 1:
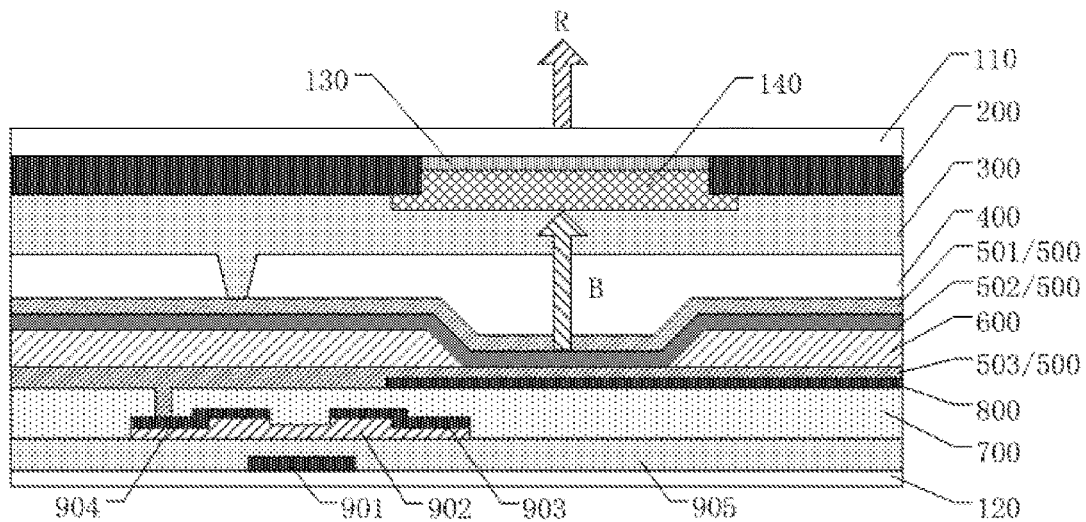
FIG. 1 is a cross-sectional structural schematic diagram of a red sub-pixel region of a display substrate.

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Unless otherwise defined, all the technical and scientific terms used herein have the same meanings as commonly understood by one of ordinary skill in the art to which the present disclosure belongs. The terms, such as "first," "second," or the like, which are used in the description and the claims of the present disclosure, are not intended to indicate any sequence, amount or importance, but for distinguishing various components. The terms, such as "comprise/comprising," "include/including," or the like are intended to specify that the elements or the objects stated before these terms encompass the elements or the objects and equivalents thereof listed after these terms, but not preclude other elements or objects. The terms, such as "connect/connecting/connected," "couple/coupling/coupled" or the like, are not limited to a physical connection or mechanical connection, but may include an electrical connection/coupling, directly or indirectly. The terms, "on," "under," or the like are only used to indicate relative position relationship, and when the position of the object which is described is changed, the relative position relationship may be changed accordingly.

A color gamut of a sub-pixel unit of a display panel is improved by using a color filter; due to a spectrum of a light-emitting unit and a transmission spectrum of the color filter, light emitted by the light-emitting unit darkens greatly after passing the color filter. A fluorescent film can improve a luminescent peak of light and reduce a half width of a wavelength of the light, if the fluorescent film is arranged in the sub-pixel unit, a color gamut higher than that of a common color filter used currently can be realized, but the fluorescent film may emit light, for example, when the fluorescent film is excited by blue light having short wavelength, therefore, in order to improve the color gamut and prevent reflection and light emission caused by the outside world, such as the excitation of the blue light, it is still necessary to arrange the color filter on the fluorescent film.

As described above, the fluorescent film may be applied to a display substrate, has characteristics of adjustable luminescent peak and narrowed half peak width, and may obtain a better color gamut as compared with a manner of arranging a color filter in a pixel region. However, the fluorescent film may be excited by blue light of natural light to emit light, so a color filter is further required to be arranged on the fluorescent film, and by filtering the light, the color gamut of the light emitted in the pixel region is improved while preventing the reflection and the light emission caused by the excitation of external blue light. An arrangement of the color filter in each pixel region results in an additional process flow, and the arrangement of the color filter may also reduce brightness of passed light, so that high Light emitting efficiency may not be obtained.

Light sources of a current display substrate, for example, may include blue light or white light, and structures of sub-pixel units of different colors thereof are also different for the light sources providing light of different colors. Hereinafter, current technology is described by taking a red sub-pixel unit in a display substrate as an example.

FIG. 1 is a cross-sectional structural schematic diagram of a red sub-pixel region of a display substrate. For example, in a case that a display substrate utilizes a fluorescent film layer structure, for example, a light source is a blue light source, for example, as shown in FIG. 1, a color filter layer 130 and a fluorescent film layer 140 are sequentially arranged on a first substrate 110 in a sub-pixel unit. The fluorescent film layer 140, for example, may be a red fluorescent film layer, that is, the fluorescent film layer 140 may emit red light after being excited by blue light. However, for example, the fluorescent film layer 140 may also be excited by blue light in external environment. Therefore, in order to prevent external blue light from exciting the fluorescent film layer for reflection, it is necessary to arrange the red color filter 130 on the fluorescent film layer 140 to prevent, for example, the blue light in the external environment.

Figure 2:
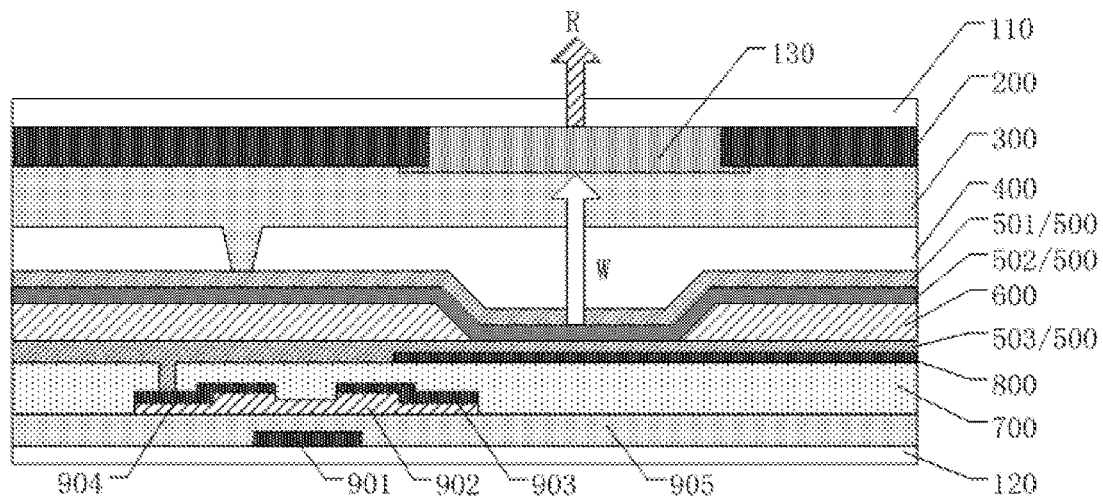
FIG. 2 is a cross-sectional structural schematic diagram of a red sub-pixel region of another display substrate.

FIG. 2 is a cross-sectional structural schematic diagram of a red sub-pixel region of another display substrate. In a case that a light source of a display substrate is white light, for example, as shown in FIG. 2, a color filter layer 130 is arranged on a first substrate 110 in a sub-pixel unit. The color filter layer 130, for example, may be a red color filter.

White light emitted by the light source emits red light after passing the red color filter. However, due to limited spectrum of the white light, a color gamut of the light emitted by the sub-pixel unit is very low, and for example, high color gamut may not be realized by the white light in related art, as measured by the color gamut up to 85% to 90% in NTSC (National Television Standards Committee) standard.

At least one embodiment of the present disclosure provides a display substrate and a manufacture method thereof, and a display panel to solve the problems described above. The display substrate comprises a first substrate and a medium film laminated layer arranged on the first substrate, the first substrate includes a plurality of pixel units, each of the pixel units at least includes a first sub-pixel unit, a second sub-pixel unit and a third sub-pixel unit, and the medium film laminated layer at least covers the first sub-pixel unit and the second sub-pixel unit. The medium film laminated layer, for example, may be configured to eliminate blue light in a first wavelength range passing the medium film laminated layer, the medium film laminated layer includes at least one first medium film layer and at least one second medium film layer which are laminated alternately, and a refractive index of the first medium film layer is greater than a refractive index of the second medium film layer. In order to facilitate illustrating technical solutions in embodiments of the present disclosure, the technical solutions in the following embodiments of the present disclosure are described by taking one sub-pixel unit (for example, the first sub-pixel unit) in the pixel unit as an example.

The medium film laminated layer is arranged in a light-emitting direction of the first sub-pixel unit, and the light-emitting direction is a emitting direction of light in a backlight or a direction for displaying to external environment provided by the first sub-pixel unit of the display substrate; the medium film laminated layer, for example, may be arranged on a side of the first substrate facing the external environment on the display side, and may also be arranged between the first substrate and the backlight; and for the first sub-pixel unit provided with the fluorescent film layer, the medium film layer is arranged between the external environment and the fluorescent film layer.

By alternately arranging film layers of different refractive indices in the medium film laminated layer, blue light having or close to a first center wavelength range may be eliminated by interfering incident light, thereby avoiding bad display effect caused by the blue light in the center wavelength range, for example, exciting the fluorescent film layer. For example, for a display substrate provided with a fluorescent film layer in a first sub-pixel unit, for example, blue light having short wavelength may excite the fluorescent film layer to emit light, for example, excite the fluorescent film layer to generate blue light. In one aspect, the medium film laminated layer may eliminate the blue light in the wavelength range that may excite the fluorescent film layer which is incident from the external environment, so as to prevent the fluorescent film layer from being excited by the blue light in the external environment; in another aspect, the blue light emitted by exciting the fluorescent film layer by the blue light in the backlight may be eliminated; and an arrangement of the medium film laminated layer may prevent, for example, water vapor from entering the display substrate, so as to play a role of packaging and the cost can be reduced.

It should be noted that, the medium film laminated layer, for example, may be configured to only eliminate blue light in a first wavelength range passing the medium film laminated layer, that is, light such as blue light in other wavelength bands or light of other colors, may pass through the medium film laminated layer.

For ease of understanding, in the following embodiments of the present disclosure, only a structure of the medium film laminated layer is selected for analysis, that is, there is only influence of the medium film laminated layer on elimination of light, and the first substrate is not analyzed. However, it should be noted that, the first substrate, for example, may also jointly eliminate the light in the first wavelength range such as the blue light together with the medium film laminated layer. For example, the first substrate has high refractive index with respect to a second medium film layer, and the second medium film layer is arranged between the first substrate and the first medium film laminated layer, and in this way the light may also be reflected in the second medium film layer, so as to generate interference among a plurality of beams of light, thereby eliminating the light having the first center wavelength by using a principle of interference cancellation.

Refractive indices of respective layers in the medium film laminated layer are different, and by setting parameters thereof such as thickness, refractive index, number of layers and so on, blue light in a first wavelength range passing the medium film laminated layer may be eliminated, for example, according to a principle of interference cancellation. In some embodiments, for example, a fluorescent film layer for improving a color gamut is arranged in the first sub-pixel unit, and the blue light, for example, which may excite the fluorescent film layer, may be eliminated by arranging the medium film layer, so that it is not necessary to arranging a color filter structure.

It should be noted that, in at least one embodiment of the present disclosure, a display substrate is not limited to a display substrate using an organic light-emitting diode as a light source, and may also be applied to, for example, a liquid crystal display substrate. Taking a liquid crystal display panel as an example, for example, a first sub-pixel unit of a display substrate thereof may also be provided with a fluorescent film layer for improving a color gamut displayed by the first sub-pixel unit, and after a medium film laminated layer is arranged on the display substrate thereof, part of the blue light passing the medium film laminated layer may also be eliminated, thereby eliminating reflection and emission caused by exciting the fluorescent film layer by the blue light. In order to facilitate illustrating technical solutions of the present disclosure, the technical solutions in the following embodiments of the present disclosure are described by taking a display substrate using an organic light-emitting diode as a light source as an example.

A display substrate and a manufacture method thereof, a display panel according to embodiments of the present disclosure are described in connection with accompanying drawings.

It should be noted that, in at least one embodiment of the present disclosure, quantity of sub-pixel units in each pixel unit is not limited, and color of light emitted by a first sub-pixel unit, a second sub-pixel unit and a third sub-pixel unit is not limited. In order to facilitate illustrating technical solutions in embodiments of the present disclosure, the technical solutions in the following embodiments of the present disclosure are described by taking an example that the first sub-pixel unit is a red sub-pixel unit, the second sub-pixel unit is a green sub-pixel unit, and the third sub-pixel unit is a blue sub-pixel unit, where, R is red light, G is green light, B is blue light, and W is white light.

At least one embodiment of the present disclosure provides a display substrate, and the display substrate, for example, may comprise three sub-pixel units of red, green and blue, and the three sub-pixel units also have different arrangements for light sources of different colors (e.g., blue light, white light, etc.). For ease of understanding, in at least one embodiment of the present disclosure, the red sub-pixel unit is selected to explain structures and functions of the display substrate in a case that the light source supplies the blue light. However, it should be understood by those skilled in the art that the functional explanation for each structure in the red sub-pixel unit is also applicable to the sub-pixel units of other colors.

Figure 3A:
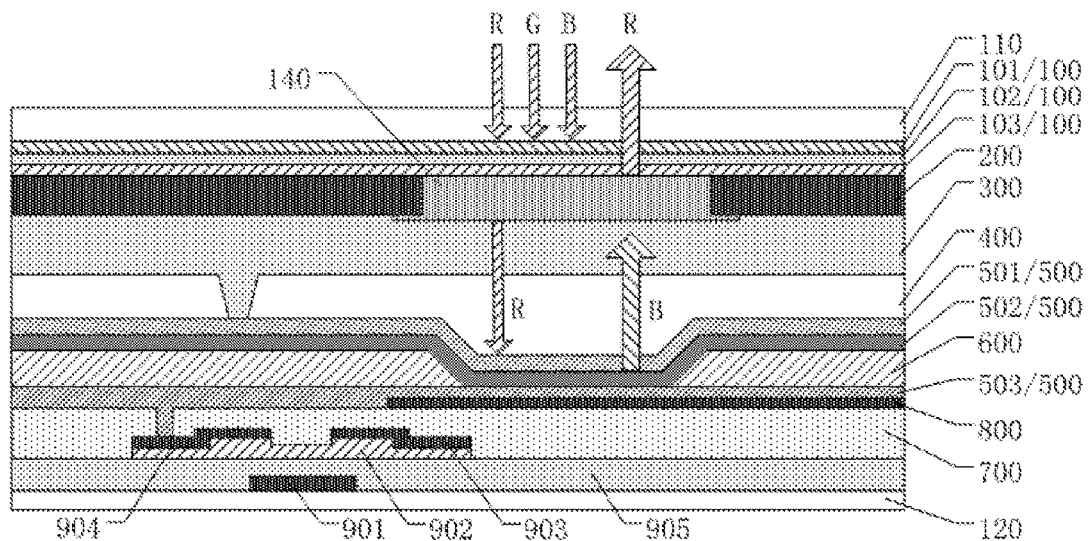
FIG. 3a is a cross-sectional structural schematic diagram of a red sub-pixel region of a display substrate provided by one embodiment of the present disclosure.

For example, in at least one embodiment of the present disclosure, FIG. 3a is a cross-sectional structural schematic diagram of a red sub-pixel region of a display substrate provided by one embodiment of the present disclosure. For example, as shown in FIG. 3a, the display substrate comprises a first substrate 110, a sub-pixel unit arranged on the first substrate 110 and a medium film laminated layer 100 arranged in a light-emitting direction of the sub-pixel unit. Herein, the medium film laminated layer 100, for example, may eliminate blue light in a first wavelength range passing the medium film laminated layer, the medium film laminated layer 100 includes at least one first medium film layer 101 and at least one second medium film layer 102 which are laminated alternately, the medium film laminated layer 100, for example, may include at least three first medium film layers and at least three second medium film layers, or the medium film laminated layer 100, for example, may include at least five first medium film layers and at least five second medium film layers, and a refractive index of the first medium film layer 101 is greater than a refractive index of the second medium film layer 102.

For example, in at least one embodiment of the present disclosure, the medium film laminated layer 100 comprises three layers of film, that is, a layer of a second medium film layer is arranged between two first medium film layers having high refractive indices. For example, the first medium film layer may be a thin film through which light may transmitted, e.g., a thin film of silver having high reflective index, and the second medium film layer is a transparent film layer of magnesium fluoride having low refractive index. Light entering the second medium film layer is reflected on an interface of the second medium film layer and the first medium film layer, so that the light is reflected repeatedly in the second medium film layer, that is, there is interference among a plurality of beams of light entering the second medium film layer, and interference cancellation may be generated at least between the light having the first center wavelength.

It should be noted that, in the embodiments of the present disclosure, specific structure of the medium film laminated layer 100 is not limited, and the medium film laminated layer 100 is not limited to the three-layer film structure described above, as long as the medium film laminated layer 100 may eliminate the blue light in the first wavelength range. For example, in at least one embodiment of the present disclosure, the medium film laminated layer 100 may also be of a multi-layer film system structure, which may be regarded as a structure in which a interlayer is arranged between two high-reflection film system, and has basic working principle as the medium film laminated layer in the three-layer films structure described above, i.e., the interference cancellation of light. For example, the second medium film layer 102 may serve as a interlayer, and the high-reflection film system may be regarded as a multi-layer film system in which a plurality of film layers having high refractive index and film layers having low refractive index are arranged alternately. By designing thicknesses of respective film layers in the medium film laminated layer 100, one or more beams of light having a center wavelength may be filtered by using a principle of interference cancellation of light. A following embodiment (the embodiment of calculating the thickness of the second medium film layer 102) may be referred for designing the thicknesses of respective film layers in the medium film laminated layer 100, which will not be repeated in the present disclosure.

In at least one embodiment of the present disclosure, as shown in FIG. 3a, the medium film laminated layer 100 may further include a plurality of other film layers such as a third medium film layer 103 and the like. For example, in a case that a second dielectric layer 102 is arranged between the third medium film layer 103 and the first medium film layer 101, the third medium film layer 103 and the first medium film layer 101 may be made of same material, or different materials, as long as a refractive index thereof is greater than a refractive index of the second medium film layer 102. Similarly, materials between two film layers having low refractive indices adjacent to a film layer having high refractive index may be same or different. For ease of description, in the following embodiments, the film layers having high refractive index is uniformly represented by the first medium film layer 101, and the film layers having low refractive index is uniformly represented by the second medium film layer 102. It should be understood by those skilled in the art that, in the present disclosure the film layer having high refractive index and the film layer having low refractive index refer to difference existing in the refractive indices between different film layers instead of the first refractive index value.

It should be noted that, the fluorescent film layer may be excited by various kinds of light to generate various kinds of light. For example, a red fluorescent film is taken as an example, the red fluorescent film may be excited by blue light or violet light to emit red light, and meanwhile the red fluorescent film is excited by the blue light or ultraviolet light to possibly generate small amount of blue light, and a center wavelength of the excited blue light is different from that of the incident blue light, however, the excited blue light, for example, may have a wavelength in the first wavelength range. In all embodiments of the present disclosure and examples thereof, the blue light to be eliminated refer to the blue light in the first wavelength range (e.g., from a first center wavelength to a second center wavelength) which may be eliminated or absorbed by the medium film laminated layer, the eliminated blue light in the wavelength range, for example, may include blue light in a corresponding wavelength range in the environment and blue light in the corresponding wavelength range emitted by the excited fluorescent film such as the red fluorescent film.

The blue light in the external environment is eliminated or weakened for one time by the medium film laminated layer 100 (a proportion of the blue light having the wavelength which is not eliminated or weakened is very small or even negligible) in a process of entering the sub-pixel unit, and even if the fluorescent film layer is excited by the remaining blue light which is not eliminated or other light that may excite the fluorescent film layer such as violet light, other light emitted by the fluorescent film layer such as blue light may be eliminated or weakened by the medium film laminated layer 100 again, and in this way, for the external environment, a proportion of blue light which is reflected or emitted to the light emitted by the sub-pixel units is very limited, which may be negligible, that is, it can be considered to some extent that an arrangement of the medium film laminated layer 100 eliminates light emitting or reflecting phenomenon of the fluorescent film layer being excited by, for example, the blue light.

For example, in at least one embodiment of the present disclosure, as shown in FIG. 3*a*, a fluorescent film layer 140 may be arranged in the sub-pixel unit, the fluorescent film layer 140, for example, may be arranged on a side of the medium film laminated layer 100 away from the external environment, and the fluorescent film layer 140 may be, for example, a red fluorescent film, which emits red and blue light after being excited by blue light. The red light emitted by the red fluorescent film after being excited by the blue light or red light in the external environment may enter into the sub-pixel unit, but display may not be affected for the red sub-pixel unit; the blue light emitted by the red fluorescent film after being excited by the blue light may be eliminated by the medium film laminated layer 100, and the blue light irradiated from the external environment may also be eliminated by the medium film laminated layer 100, so that the fluorescent film layer 140 may also not be excited.

For example, in at least one embodiment of the present disclosure, the first medium film layer 101 may be made of, for example, at least one of silicon nitride, zinc sulfide, aluminum and silver; or the second medium film layer 102 may be made of, for example, at least one of silicon oxide and magnesium fluoride. It should be noted that, for example, when the first medium film layer 101 is made of a metal material such as aluminum or silver, it is a transparent or translucent thin film. The materials of the respective medium film layers in the medium film laminated layer 100 are not limited to the above-mentioned materials, same technical effects may be obtained as long as the refractive indices between the first medium film layer 101 and the second medium film layer 102 are different.

The fluorescent film layer may be formed by adding a fluorescent material instead of pigment particles in a color filter. The fluorescent material may include, for example, silicate, chlorosilicate, aluminate, oxynitride, nitride, tungstate, molybdate, sulfur oxide, green powder of silicate or oxynitride, YAG yellow powder or red powder of nitride and the like.

There are a variety of arrangements for the medium film laminated layer 100, for example, a multi-layered film system including a film system eliminating light having a first center wavelength or a film system eliminating light having a plurality of center wavelengths. It should be noted that, the medium film laminated layer 100 may not strictly eliminate the light in the first wavelength range by 100%, and a cut-off rate of the light having the first wavelength may be improved by arranging the multi-layer film system. In this example, a working principle of the medium film laminated layer 100 is explained by taking the medium film laminated layer 100 of a simple structure (one specific center wavelength, for example, a first center wavelength, may be eliminated) as an example; however, those skilled in the art should understand that, on the basis of the same technical principle, it may also be extended to a multi-layer film system that eliminates light in a plurality of first center wavelength range.

The film layers having different reflective indices in the medium film laminated layer 100 such as the first medium film layer 101, the second medium film layer 102 and the like are arranged alternately, and taking a three-layered medium film laminated layer 100 as an example, the second medium film layer 102 having low dielectric index is arranged between two layers of the first medium film layer 101 having high refractive indices. There is a difference in the refractive index between the first medium film layer 101 and the second medium film layer 102, so that the light is reflected at an interface adjacent to the two film layers, that is, for example, the light in the second medium film layer 102 may be reflected repeatedly, there may be interference between a plurality of beams of light therein such as the light of the first center wavelength.

For example, there is interference cancellation among the plurality of beams of light in the second medium film layer 102, an optical path difference between the cancelled light should be an odd multiple of a half wavelength of the center wavelength. The shortest optical path difference between the cancelled light is twice an optical thickness of the second medium film layer 102, and in the case of setting the first center wavelength, actual thickness of the second medium film layer may be obtained by calculating the optical thickness of the second medium film layer 102.

For example, in this example, the optical thickness of each film layer, such as the second medium film, in the medium film laminated layer satisfies a formula as follows:

$$2nh = (m-0.5)\lambda \quad m=1,2,3 \ldots$$

where, nh is an optical thickness of a corresponding film layer; n is a refractive index of the corresponding film layer; h is an actual thickness of the corresponding film layer; m is an interference level; and $\lambda$ is a center wavelength of light.

For the light of the first center wavelength $\lambda$, the refractive index n of the corresponding film layer, for example, the second medium film layer, is known, then the actual thickness h of the corresponding film layer may be obtained.

For example, in at least one embodiment of the present disclosure, the thickness of the film layer having high refractive index such as the first medium film layer 101 is not limited. For example, the first medium film layer 101 may be a light-transmitting thin film, such as a thin film of silver having a high reflective index, the second medium film layer 102 is a thin film having low refractive index such as magnesium fluoride thin film, light having center wavelength $\lambda$ may be reflected repeatedly in the second medium film layer, and chance of interference between a plurality of beams of light having corresponding wavelengths is increased.

It should be noted that, in the medium film laminated layer 100, at least one layer of the medium film layer having low refractive index such as the second medium film layer 102 has the thickness satisfying the requirement of the above formula. For example, a medium film laminated layer comprising a thin film of sliver having high refractive index and the second medium film layer 102 made of thin film of magnesium fluoride having low refractive index is taken as an example, a medium film laminated layer of three-layer structure of silver-magnesium fluoride-silver is formed here, wherein the film layer of the thin film of magnesium fluoride having low refractive index should satisfy the above formula, so that a plurality of beams of light having the first center wavelength may be interfered and cancelled in the film layer, and there is no requirement on the thickness of the thin film of silver having high reflective index, as long as it is transparent and satisfied that the light may be reflected at an interface with the thin film of magnesium fluoride.

For example, in at least one embodiment of the present disclosure, the thickness of the film layer having high refractive index such as the first medium film layer may also satisfy the above formula. For example, the medium film laminated layer 100 is a multi-layer film system where the high and low refractive indices are laminated alternately. When the light to be eliminated has the first center wavelength, optical thicknesses of respective layers in the film system may be, for example, constant; when the lights to be eliminated have a plurality of center wavelengths, optical thicknesses of respective layers in the film system should be specifically arranged based on the above formula, that is, the optical thicknesses of the respective layers may be different.

For example, the arrangement of multi-layer film system may satisfy $G_1HLHL \ldots HLH \ldots LHLHG_2$, where $G_1$ and $G_2$ may be protective film layers such as glass, H is a film layer having high refractive index (equivalent to a first medium film layer), L is a film layer having low refractive index (equivalent to a second medium film layer). The structure of multi-layer film system of the medium film laminated layer 100 may enhance effect of filtering the light having the first center wavelength by alternately laminating the film layer having high reflective index and the film layer having low reflective index, and interference cancellation may generated in the lights of a plurality of center wavelengths by setting parameters of different film layers such as thickness, that is, the medium film laminated layer 100 may filter or eliminate light in wider wavelength range.

For example, in at least one embodiment of the present disclosure, optical thicknesses of respective film layers in the medium film laminated layer 100, for example, may be set to a quarter of the center wavelength of the blue light to be eliminated. In a case of satisfying this condition, the light corresponding to the center wavelength, for example, obtains the strongest reflection on each interface, and the light in the center wavelength range does not transmit through the medium film laminated layer after optical interference cancellation of multiple layers.

It should be noted that, the optical thickness of the film layer is a product of refractive index thereof and actual thickness of the film layer. For example, for eliminating light of same center wavelength, the optical thickness of the medium film layer made of different materials may be determined, for example, a quarter of the center wavelength, however, for example, in a case that the materials are different and the refractive indices are different, the actual thicknesses of the medium film layers made of different materials are different, too. It should be understood by those skilled in the art that, an selection is that optical thicknesses of respective film layers in the medium film laminated layer are a quarter of the center wavelength of the light to be eliminated, when the optical thickness of the film layer is close to this value, the light of the first center wavelength may also be eliminated or weakened; in the multi-layer film system, similarly, a thickness of a film layer having high refractive index is a quarter of the center wavelength of the light to be eliminated, the relatively excellent effect of filtering the light of the first wavelength can be achieved for the medium film laminated layer, where the film layer having high refractive index (for example the film layer using thin film of silver having high reflective index) may also be set to other thicknesses, same technical effects may be obtained as long as the light may be reflected in the film layer having low refractive index.

For example, in at least one embodiment of the present disclosure, center wavelength of blue light to be eliminated may be in a range of 400 nm to 460 nm, and blue light having the center wavelength less than or equal to 450 nm may be eliminated, alternatively.

When the medium film laminated layer 100 is of a structure of multi-layer film system, a high reflective index region thereof, for example, may approach a limit as the number of film layers increases, and corresponding wavelength band may be referred to as a bandwidth. For example, in at least one embodiment of the present disclosure, the medium film laminated layer 100 is configured to eliminate blue light having bandwidth within at least 35 nanometers with respect to a center wavelength. For example, taking an example that the center wavelength of the blue light to be eliminated is 440 nm and the required bandwidth is 40 nm, the requirement on eliminating the light having wavelength in a range of 420 to 460 nm may be satisfied by designing parameters of the medium film laminated layer 100 such as quantity of layers and thicknesses of respective layers and so on.

For example, in at least one embodiment of the present disclosure, respective medium film layers in a multi-layer film system may be obtained by conventional simulation calculation software. For example, the film system may be pre-designed by using TFCalc or Essential Macleod film system design software, so as to determine parameters of the medium film layers in the medium film laminated layer 100 such as quantity, thicknesses and refractive indices and so on.

In the embodiments of the present disclosure, the medium film laminated layer 100 is not limited to being arranged between the first substrate 110 and the fluorescent film or the color filter; for example, the medium film laminated layer 100 may also be arranged on a side of the first substrate facing ambient light; for example, the medium film laminated layer 100 is not limited to an integral layered structure, for example, the medium film laminated layer 100 may also be arranged in a corresponding sub-pixel unit in an array. In at least one embodiment of the present disclosure, position for arranging the medium film laminated layer 100 is not specifically limited, as long as the medium film laminated layer 100 is arranged in such a position to eliminate light entering the sub-pixel unit such as blue light, that is, reflecting and light emitting phenomenon of the fluorescent film layer being excited by, for example, the blue light, may be prevented.

For example, in at least one embodiment of the present disclosure, as shown in FIG. 3a, the display substrate may further be provided with a black matrix 200. The black matrix 200, for example, may block light in regions outside the sub-pixel unit and improve display contrast, so as to prevent color mixing and increase purity of color.

For example, in at least one embodiment of the present disclosure, as shown in FIG. 3a, the display substrate may further comprise a pixel defining layer 600, the pixel defining layer 600, for example, may define boundary of sub-pixel units (e.g., a red sub-pixel unit, a green sub-pixel unit and a blue sub-pixel unit).

For example, in at least one embodiment of the present disclosure, a light source is a light-emitting device such as an organic light-emitting diode arranged in a sub-pixel unit. For example, as shown in FIG. 3a, the display substrate may further comprise a light-emitting device 500 arranged in a sub-pixel unit. For example, the light-emitting device 500 may include a first electrode layer 501, a light-emitting layer 502 and a second electrode layer 503 which are laminated sequentially, and for example, may include an electron injection layer, an electron transport layer, a hole transport layer, a hole injection layer and the like. The first electrode layer 501 and the second electrode layer 502 may be anode and cathode to each other.

For example, in at least one embodiment of the present disclosure, as shown in FIG. 3a, the display substrate may further comprise a second substrate 120 arranged opposite to the first substrate 110. A thin film transistor is arranged on a side of the second substrate 120 facing the first substrate 110, and the thin film transistor, for example, may include a gate electrode 901, a gate insulating layer 905, an active layer 902, a source electrode 903, a drain electrode 904 and the like. For example, the drain electrode 904 of the thin film transistor layer may be electrically connected with, for example, the second electrode layer 503 of the light emitting device 500 to control switching on and switching off of the light emitting device 500 in the sub-pixel unit. For example, a passivation layer 700 may be arranged between a layer of the thin film transistor and the second electrode.

For example, in at least one embodiment of the present disclosure, as shown in FIG. 3a, the display substrate may further comprise a spacer layer 300 and a packaging layer 400 which are arranged between the first substrate 110 and the second substrate 120, for supporting and packaging a box-structure display substrate.

For example, in at least one embodiment of the present disclosure, as shown in FIG. 3a, for example, the second electrode layer 503 may be a transparent conductive material, so that the display substrate may further comprise a light-shielding layer 800 arranged at the sub-pixel unit. The light-blocking layer 800 may be, for example, an opaque metal layer, and the light-blocking layer 800, for example, may also be configured to have light-reflecting property.

In at least one embodiment of the present disclosure, as shown in FIG. 3a, a fluorescent film layer 140 may also be, for example, a green fluorescent film. In this case, the fluorescent film layer 140 emits green light after being excited by blue light. The blue light in the environment is eliminated by the medium film laminated layer 100, so that the external blue light may not excite the fluorescent film layer 140, and it is only necessary to arrange the green fluorescent film layer in the green sub-pixel unit, no green color filter is required.

In at least one embodiment of the present disclosure, as compared with current display substrate structure provided with a fluorescent film, red and green sub-pixel units, for example, may be provided only with a fluorescent film layer, and no color filter of corresponding color is required, thereby reducing technical processes of preparing the corresponding color filter. The medium film laminated layer 100 is arranged to eliminate blue light entering the sub-pixel unit from the external environment, and package the display substrate at the same time. For example, the medium film laminated layer 100 may block moisture from entering the display substrate, so as to reduce preparation cost of the display substrate.

It should be noted that, in embodiments of the present disclosure, whether the medium film laminated layer 100 is arranged in a third sub-pixel unit (e.g., a blue sub-pixel unit) is not limited. For example, in some embodiments of the present disclosure, the medium film laminated layer 100 is arranged to cover a third sub-pixel unit (e.g., a blue sub-pixel unit), that is, the blue sub-pixel unit may include a medium film laminated layer 100 located on a side of blue color filter away from an organic light-emitting diode; For example, in some embodiments of the present disclosure, the medium film laminated layer 100 is located outside the third sub-pixel unit, that is, the medium film laminated layer 100 is not arranged in the third sub-pixel unit (e.g., the blue sub-pixel unit). In order to facilitate illustrating technical solutions in embodiments of the present disclosure, the technical solutions in the following embodiments of the present disclosure are described by taking an example that the third sub-pixel unit is a blue sub-pixel unit and a medium film laminated layer is arranged in the blue sub-pixel unit.

Figure 3B:
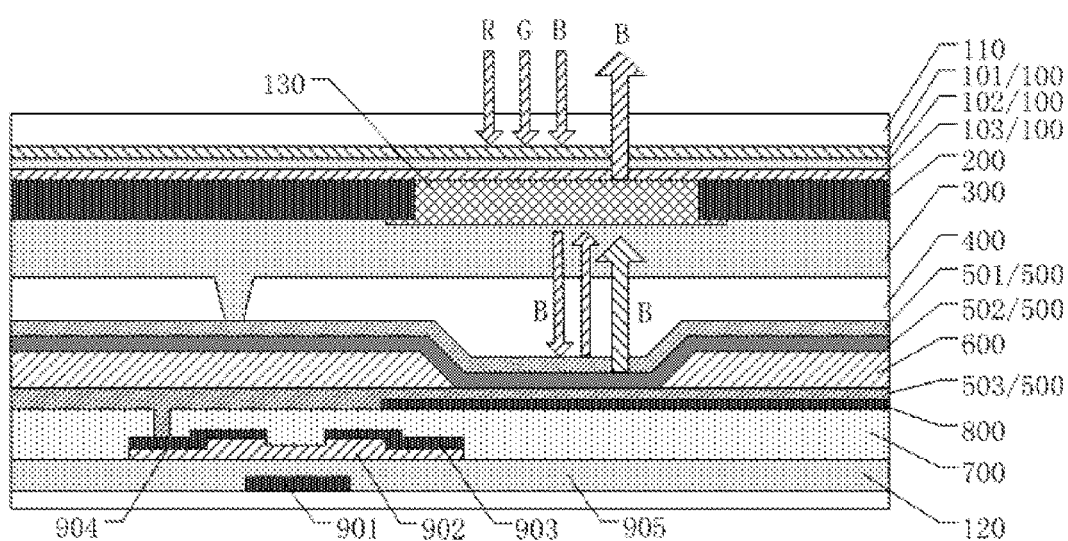
FIG. 3b is a cross-sectional structural schematic diagram of a blue sub-pixel region of a display substrate provided by one embodiment of the present disclosure.

For example, in at least one embodiment of the present disclosure, FIG. 3b is a cross-sectional structural schematic diagram of a blue sub-pixel region of a display substrate provided by one embodiment of the present disclosure. For example, as shown in FIG. 3b, the brightness of blue light in a light source is very high, even if a medium film laminated layer 100 may not completely filter out the blue light, so that the blue sub-pixel unit may not be provided with a blue fluorescent film layer, it is only necessary to arrange a color filter layer 130 of corresponding color such as a blue color filter, so as to prevent light of other colors such as red light, green light and the like in the external environment from entering.

In at least one embodiment of the present disclosure, there is further provided a display substrate, and a light source in the display substrate provides white light. As compared with the display substrate structure where the light source is blue light in the above embodiment, the structure of the sub-pixel unit of the display substrate is different when the light source is white light. For ease of understanding, structure and function of the display substrate in the following embodiments will be illustrated by selecting the red sub-pixel unit in a case that the light source supplies white light. However, it should be understood by those skilled in the art that, the functional explanations for respective structures in the red sub-pixel unit are also applicable to the sub-pixel units of other colors (e.g., blue, green, etc.).

Figure 4A:
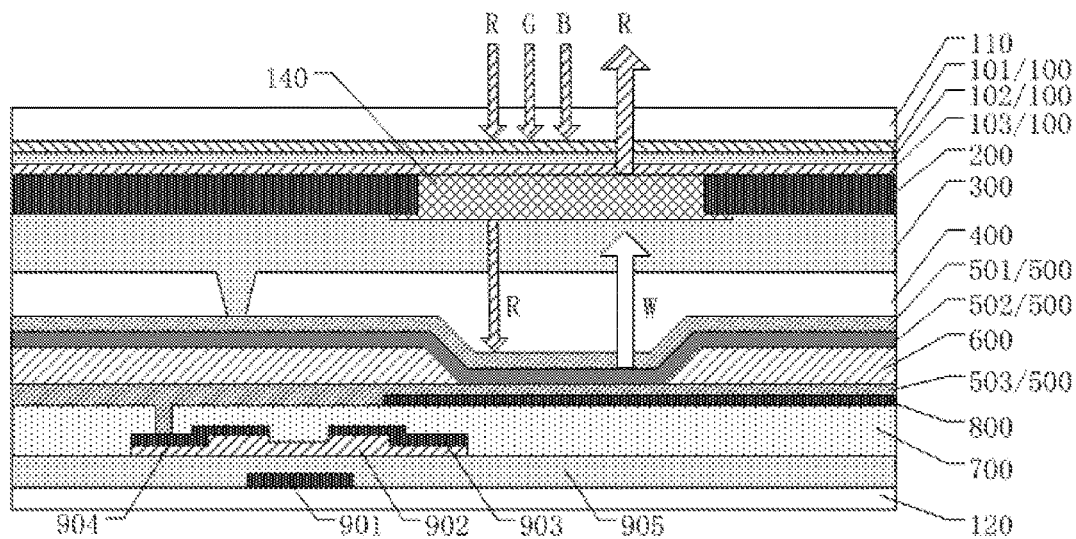
FIG. 4a is a cross-sectional structural schematic diagram of a red sub-pixel region of another display substrate provided by one embodiment of the present disclosure.

For example, in at least one embodiment of the present disclosure, FIG. 4a is a cross-sectional structural schematic diagram of a red sub-pixel region of another display substrate provided by one embodiment of the present disclosure. For example, as shown in FIG. 4a, a fluorescent film layer 140 is arranged in a sub-pixel unit of a display substrate, and for example, the fluorescent film layer 140 is a red fluorescent film layer. For example, in a case that a light source is white light, the white light is mixed light of red, green and blue light, wherein the green and blue light may both excite the red fluorescent film layer to emit red light, therefore, it is only necessary to arrange the red fluorescent film in the red sub-pixel unit, no red color filter is required.

It should be noted that, in a case that the light source is, for example, white light, the embodiments of the present disclosure do not limit arranging the red fluorescent film and the red color filter in the red sub-pixel unit, and for example, the red color filter may be arranged in the red color sub-pixel unit, that is, the red sub-pixel unit may include at least one of the red fluorescent film and the red color filter which are arranged between the medium film laminated layer 100 and the organic light emitting diode. For example, in at least one embodiment of the present disclosure, in the case that a red color filter and a red color fluorescent film are arranged in a red sub-pixel unit, the red color filter may be arranged between the red color fluorescent film and the medium film laminated layer, so that the red fluorescence film layer may be not affected by ambient light, and green and blue light in white light may excite the red fluorescent film to emit red light, which may increase brightness of the red sub-pixel unit, and light of other colors in the white light may be filtered by the red color filter without affecting display effect of the red sub-pixel unit.

The red fluorescent film may be excited by blue light for generating blue light, a proportion of the generated blue light is very small and negligible, and the medium film laminated layer may eliminated the excited blue light partially or even completely again.

Figure 4B:
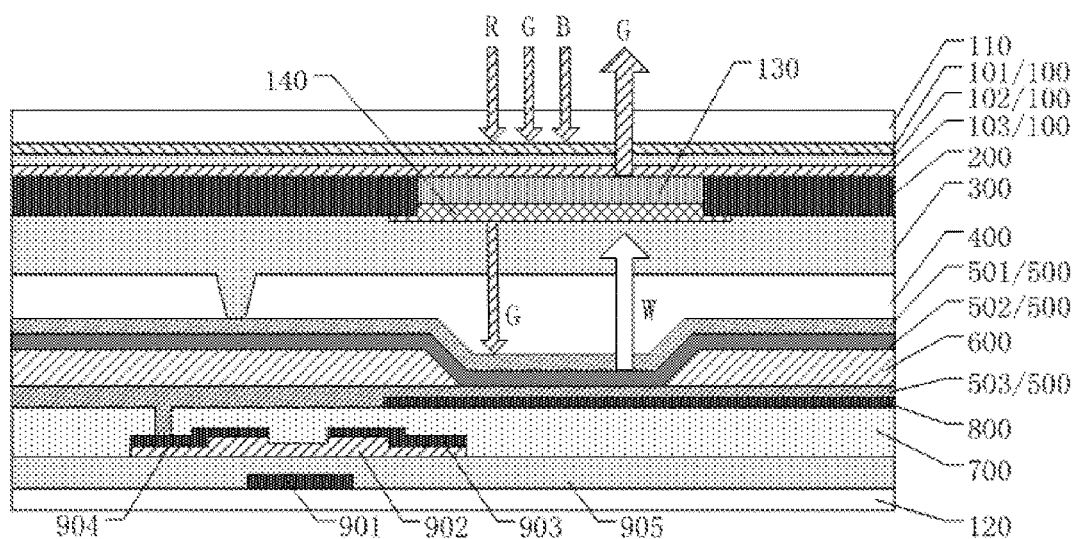
FIG. 4b is a cross-sectional structural schematic diagram of a green sub-pixel region of another display substrate provided by one embodiment of the present disclosure.

For example, in at least one embodiment of the present disclosure, FIG. 4b is a cross-sectional structural schematic diagram of a green sub-pixel region of another display substrate provided by one embodiment of the present disclosure. For example, as shown in FIG. 4b, a fluorescent film layer 140 is arranged in a sub-pixel unit in a display substrate, and for example, the fluorescent film layer 140 is a green fluorescent film layer. In a case that a light source is, for example, white light, the white light is mixed light of red, green and blue light, wherein the blue light may excite the green fluorescent film layer to emit green light, but the red light may pass the fluorescent film layer 140, so that it is necessary to arrange a green color filter layer 130 in the green sub-pixel unit to filter the red light. The green color filter layer 130, for example, may be arranged between the fluorescent film layer 140 and the medium film laminated layer 100 to filter the transmitted red light. Therefore, in at least one embodiment of the present disclosure, as shown in FIG. 4b, in the case that the light source, for example, is white light, the green color filter is arranged between the green fluorescent film and the medium film laminated layer 100.

Figure 4C:
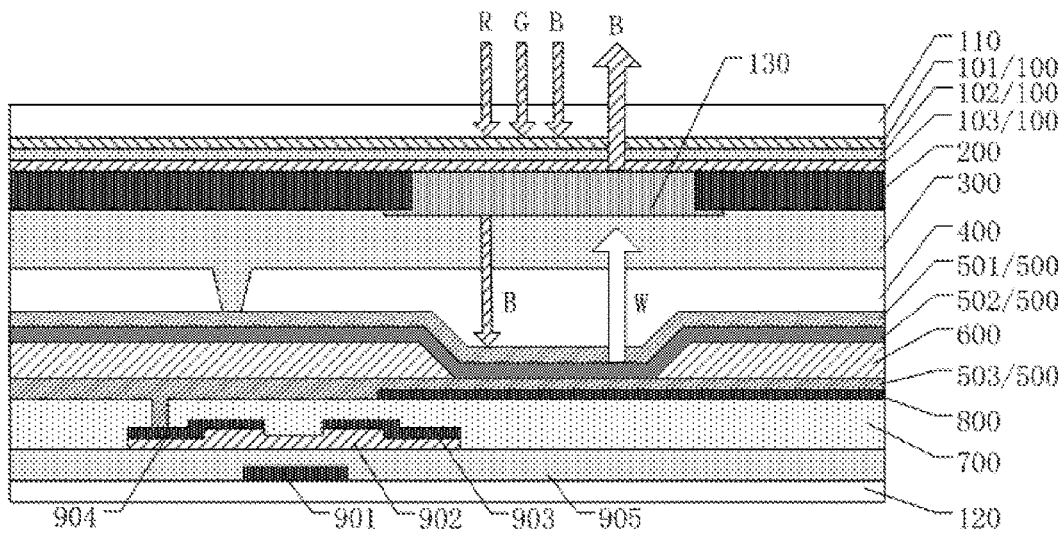
FIG. 4c is a cross-sectional structural schematic diagram of a blue sub-pixel region of another display substrate provided by one embodiment of the present disclosure.

For example, in at least one embodiment of the present disclosure, FIG. 4c is a cross-sectional structural schematic diagram of a blue sub-pixel unit region of another display substrate provided by an embodiment of the present disclosure. For example, as shown in FIG. 4c, a light source in a display substrate emits white light, a medium film laminated layer 100 eliminates or weakens light in a specific wavelength range, and may not filter blue light in all wavebands in the white light, therefore, the blue light in the white light may still transmit partially, and it is still necessary to arrange a blue color filter 130 in the blue sub-pixel unit, so as to filter light of other colors in the white backlight. That is, in a case where the white backlight is applied to the display substrate, an arrangement manner of the blue sub-pixel unit may be same as the conventional method.

It should be noted that, in the embodiments of the present disclosure, in the case that the medium film laminated layer 100 may be arranged to cover the first sub-pixel unit, the second sub-pixel unit and the third sub-pixel unit, the medium film laminated layer 100 may be arranged to cover entire region of the first substrate 100, or may also be arranged to cover only a region where the pixel unit of the first substrate 100 is located, and specific arrangement of the medium film laminated layer 100 may be determined according to actual needs, which is not limited by the present disclosure herein.

Figure 4D:
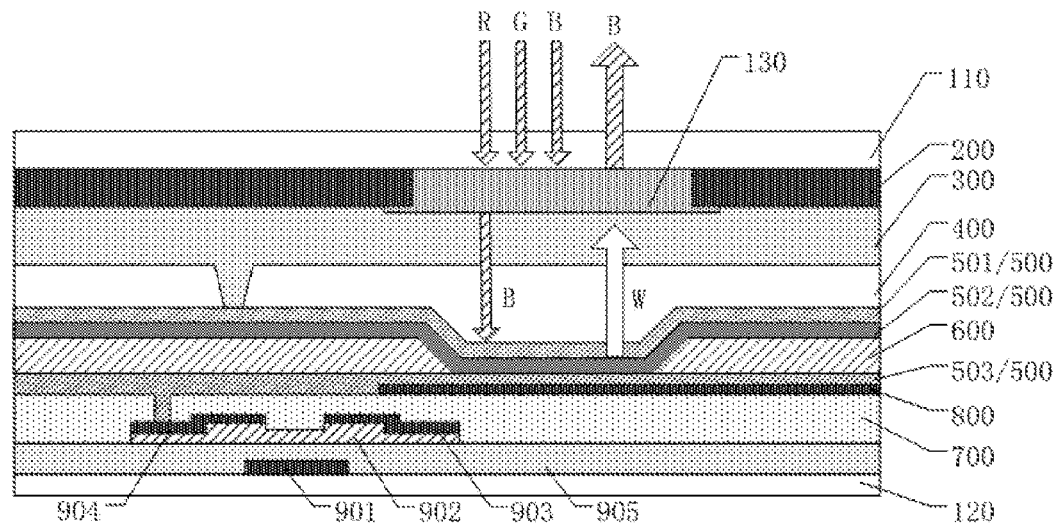
FIG. 4d is a cross-sectional structural schematic diagram of a blue sub-pixel region of another display substrate provided by one embodiment of the present disclosure.

For example, in at least one embodiment of the present disclosure, a medium film laminated layer 100 may not be arranged in a third sub-pixel unit (e.g., a blue sub-pixel unit), i.e., the medium film laminated layer 100 is arranged in a sub-pixel except the third sub-pixel unit, and FIG. 4d is a cross-sectional structural schematic diagram of a blue sub-pixel region of another display substrate provided by one embodiment of the present disclosure. As shown in FIG. 4d, taking an example that the third sub-pixel unit is a blue sub-pixel unit, the medium film laminated layer 100 may filter blue light in some wavebands, to reduce transmittance of the blue light in the blue sub-pixel unit, so that a medium film laminated layer may not be arranged in the blue sub-pixel unit region, however, for filtering light of other colors, it is necessary to arrange a blue color filter on a light outgoing side of an organic light-emitting device of the blue sub-pixel unit. It should be noted that, in the case that no medium film laminated layer 100 is arranged in the blue sub-pixel unit, color of light emitted by the organic light-emitting device is not limited, and the organic light-emitting device may emit white light as shown in FIG. 4d, or be set to emit blue light.

At least one embodiment of the present disclosure provides a manufacture method of a display substrate, and the manufacture method of the display substrate comprises providing a first substrate including a plurality of sub-pixel units; and forming a medium film laminated layer on a light emitting direction of the sub-pixel units, wherein, the medium film laminated layer is configured to only eliminate blue light in a first wavelength range passing the medium film laminated layer, the medium film laminated layer including at least one first medium film layer and at least one second medium film layer which are laminated alternately, and a refractive index of the first medium film layer being greater than a refractive index of the second medium film layer.

For example, in a manufacture method provided by at least one embodiment of the present disclosure, respective medium film layers alternately laminated in a medium film laminated layer may be deposited and formed by a plasma chemical vapor deposition (PECVD) device.

For example, in a manufacture method provided by at least one embodiment of the present disclosure, a second substrate opposite to a first substrate may be provided, and respective layer structures of a thin film transistor are formed on the second substrate, for example, including a gate electrode, a gate insulating layer, an active layer and a source/drain electrode layer which are arranged on the second substrate, sequentially.

The medium film laminated layer may be formed on a side of the first substrate facing the second substrate, or may be formed on a side of the first substrate away from the second substrate. The medium film laminated layer may block, for example, blue light in a first wavelength range, as long as the arrangement position of the medium film laminated layer can prevent, for example, blue light in a first wavelength range from entering and leaving the sub-pixel unit.

For example, in a manufacture method provided by at least one embodiment of the present disclosure, respective layer structures of a light-emitting device, such as a first electrode layer, a second electrode layer and a light-emitting layer, may also be formed on a display substrate where a thin film transistor structure has been formed.

It should be noted that, specific structure of the display substrate manufactured by the manufacture method provided by at least one embodiment of the present disclosure may be referred to related content in the foregoing embodiments (the embodiments about the display substrate), which will not be repeated by the present disclosure herein.

At least one embodiment of the present disclosure provides a display panel, and the display panel comprises the display substrate according to any one of the above embodiments. The display panel, for example, is applied to any product or component having a display function such as a mobile phone, a tablet computer, a television, a monitor, a notebook computer, a digital photo frame, a navigator and the like.

Embodiments of the present disclosure provide a display substrate and a manufacture method thereof, a display panel, which have at least one of beneficial effects as follows:

(1) At least one embodiment of the present disclosure provides a display substrate, and a medium film laminated layer is arranged on a display substrate provided with a fluorescent film layer, which may eliminate part of blue light entering pixel units of the display substrate and prevent the fluorescent film layer from being excited by external blue light.

(2) In a display substrate provided by at least one embodiment of the present disclosure, a medium film laminated layer may eliminate part of blue light emitted by exciting the fluorescent film layer, so as to eliminate light emission and reflection caused by exciting the fluorescent film layer by blue light.

(3) In a display substrate provided in at least one embodiment of the present disclosure, an arrangement of a medium film laminated layer may prevent, for example, water vapor from entering the display substrate, so as to play a role of packaging and reduce cost.

The following statements should be noted:

(1) The accompanying drawings involve only the structure(s) in connection with the embodiment(s) of the present disclosure, and other structure(s) can be referred to common design(s).

(2) For the purpose of clarity only, in accompanying drawings for illustrating the embodiment(s) of the present disclosure, the thickness of a layer or region may be enlarged or narrowed, that is, the drawings are not drawn in a real scale.

(3) In case of no conflict, features in one embodiment or in different embodiments can be combined.

The foregoing is only the embodiments of the present invention and not intended to limit the scope of protection of the present invention. The scope of protection of the present invention should be defined by the appended claims.

The invention claimed is:

1. A display substrate, comprising:
   a first substrate;
   a plurality of pixel units, included in the first substrate, each of the pixel units at least including a first sub-pixel unit, a second sub-pixel unit and a third sub-pixel unit;
   a medium film laminated layer arranged on the first substrate, the medium film laminated layer at least covering the first sub-pixel unit and the second sub-pixel unit;
   wherein, the medium film laminated layer is configured to eliminate blue light in a first wavelength range passing the medium film laminated layer, the medium film laminated layer only includes at least one first medium film layer and at least one second medium film layer which are adjacent to each other and are laminated alternately, and a refractive index of the first medium film layer is greater than a refractive index of the second medium film layer,
   wherein the medium film laminated layer is configured to eliminate the blue light by making interference of incident light.

2. The display substrate according to claim 1, wherein a center wavelength of the blue light has a range of 400 to 460 nanometers.

3. The display substrate according to claim 1, wherein an optical thickness of each film layer in the medium film laminated layer is a quarter of the center wavelength of the blue light.

4. The display substrate according to claim 1, wherein the medium film laminated layer is configured to eliminate blue light having bandwidth within at least 35 nanometers with respect to the center wavelength.

5. The display substrate according to claim 1, wherein, the optical thickness of each film layer in the medium film laminated layer satisfies a formula as follows:

$$2nh=(m-0.5)\lambda \ m=1,2,3 \ldots$$

where, nh is an optical thickness of a corresponding film layer; n is a refractive index of the corresponding film layer; h is a thickness of the corresponding film layer; m is an interference level; and $\lambda$ is a center wavelength of light.

6. The display substrate according to claim 1, wherein,
   the first medium film layer is made of at least one of silicon nitride, zinc sulfide, aluminum and silver; and/or
   the second medium film layer is made of at least one of silicon oxide and magnesium fluoride.

7. The display substrate according to claim 1, wherein, each sub-pixel unit of the pixel unit includes an organic light-emitting diode, the organic light-emitting diode emitting white light or blue light.

8. The display substrate according to claim 7, wherein, the organic light-emitting diode at least includes a first electrode layer, a light-emitting layer and a second electrode layer which are laminated sequentially.

9. The display substrate according to claim 7, wherein, the first sub-pixel unit is a red sub-pixel unit, the second sub-pixel unit is a green sub-pixel unit, and the third sub-pixel unit is a blue sub-pixel unit.

10. The display substrate according to claim 9, wherein, the blue sub-pixel unit includes a blue color filter arranged on a light outgoing side of the organic light-emitting diode.

11. The display substrate according to claim 10, wherein, the blue sub-pixel unit further includes the medium film laminated layer located on a side of the blue color filter away from the organic light-emitting diode.

12. The display substrate according to claim 9, wherein, the organic light-emitting diode emits blue light, the green sub-pixel unit includes a green fluorescent film arranged between the medium film laminated layer and the organic light-emitting diode.

13. The display substrate according to claim 9, wherein, the organic light-emitting diode emits white light, the green sub-pixel unit includes a green fluorescent film and a green color filter arranged between the medium film laminated layer and the organic light-emitting diode.

14. The display substrate according to claim 13, wherein, the green color filter is arranged between the green fluorescent film and the medium film laminated layer.

15. The display substrate according to claim 9, wherein, the organic light-emitting diode emits blue light, the red sub-pixel unit includes a red fluorescent film arranged between the medium film laminated layer and the organic light-emitting diode.

16. The display substrate according to claim 9, wherein, the organic light-emitting diode emits white light, the red sub-pixel unit including at least one of a red fluorescent film and a red color filter arranged between the medium film laminated layer and the organic light-emitting diode.

17. The display substrate according to claim 16, wherein, the red color filter is arranged between the red fluorescent film and the medium film laminated layer.

18. A display panel, comprising the display substrate according to claim 1.

19. A manufacture method of a display substrate, comprising:
   providing a first substrate including a plurality of sub-pixel units;
   forming a medium film laminated layer on the first substrate;

wherein, the medium film laminated layer is configured to eliminate blue light in a first wavelength range passing the medium film laminated layer, the medium film laminated layer only includes at least one first medium film layer and at least one second medium film layer which are adjacent to each other and are laminated alternately, and a refractive index of the first medium film layer is greater than a refractive index of the second medium film layer, wherein the medium film laminated layer is configured to eliminate the blue light by making interference of incident light.

20. The manufacture method according to claim 19, wherein, the forming the medium film laminated layer on the first substrate includes a plasma chemistry vapor deposition.

\* \* \* \* \*